(12) United States Patent
Ishihara et al.

(10) Patent No.: US 8,817,525 B2
(45) Date of Patent: Aug. 26, 2014

(54) SEMICONDUCTOR MEMORY DEVICE

(71) Applicants: Sharp Kabushiki Kaisha, Osaka (JP); Elpida Memory, Inc., Tokyo (JP)

(72) Inventors: Kazuya Ishihara, Osaka (JP); Yukio Tamai, Osaka (JP); Takashi Nakano, Osaka (JP); Akiyoshi Seko, Tokyo (JP)

(73) Assignees: Sharp Kabushiki Kaisha, Osaka-shi, Osaka (JP); Elpida Memory, Inc., Chou-ku, Tokyo (JP)

( * ) Notice: Subject to any disclaimer, the term of this patent is extended or adjusted under 35 U.S.C. 154(b) by 0 days.

(21) Appl. No.: 13/959,267

(22) Filed: Aug. 5, 2013

(65) Prior Publication Data

US 2014/0036573 A1 Feb. 6, 2014

(30) Foreign Application Priority Data

Aug. 3, 2012 (JP) ................................. 2012-173091

(51) Int. Cl.
*G11C 11/00* (2006.01)
*G11C 13/00* (2006.01)

(52) U.S. Cl.
CPC ........ *G11C 13/0021* (2013.01); *G11C 13/0007* (2013.01)
USPC ........................................................ 365/148

(58) Field of Classification Search
CPC ........... G11C 13/0007; G11C 13/0069; G11C 13/0097
USPC ........................................................ 365/148
See application file for complete search history.

(56) References Cited

U.S. PATENT DOCUMENTS

| 6,204,139 | B1 | 3/2001 | Liu et al. | |
| 8,101,983 | B2 * | 1/2012 | Seo et al. | 257/295 |
| 8,125,818 | B2 * | 2/2012 | Muraoka et al. | 365/148 |

OTHER PUBLICATIONS

Baek et al., "Highly Scalable Non-volatile Resistive Memory using Simple Binary Oxide Driven by Asymmetric Unipolar Voltage Pulses", *IEDM*, 2004, pp. 587-590.

* cited by examiner

*Primary Examiner* — Harry W Byrne
*Assistant Examiner* — Lance Reidlinger
(74) *Attorney, Agent, or Firm* — Nixon & Vanderhye, P.C.

(57) ABSTRACT

A semiconductor memory device includes a memory cell array having a plurality of memory cells arranged in a matrix, each memory cell being configured such that a variable resistance element and a selection transistor are connected in series. A set operation for a memory cell (an operation of converting the resistance of the variable resistance element to a low resistance) is performed by applying a set voltage pulse for a longer time than that for a reset operation (an operation of converting the resistance of the variable resistance element to a high resistance) while limiting, using the selection transistor, an electric current flowing in the set operation to a certain low electric current, and by simultaneously applying the set voltage pulse to the plurality of memory cells.

11 Claims, 8 Drawing Sheets

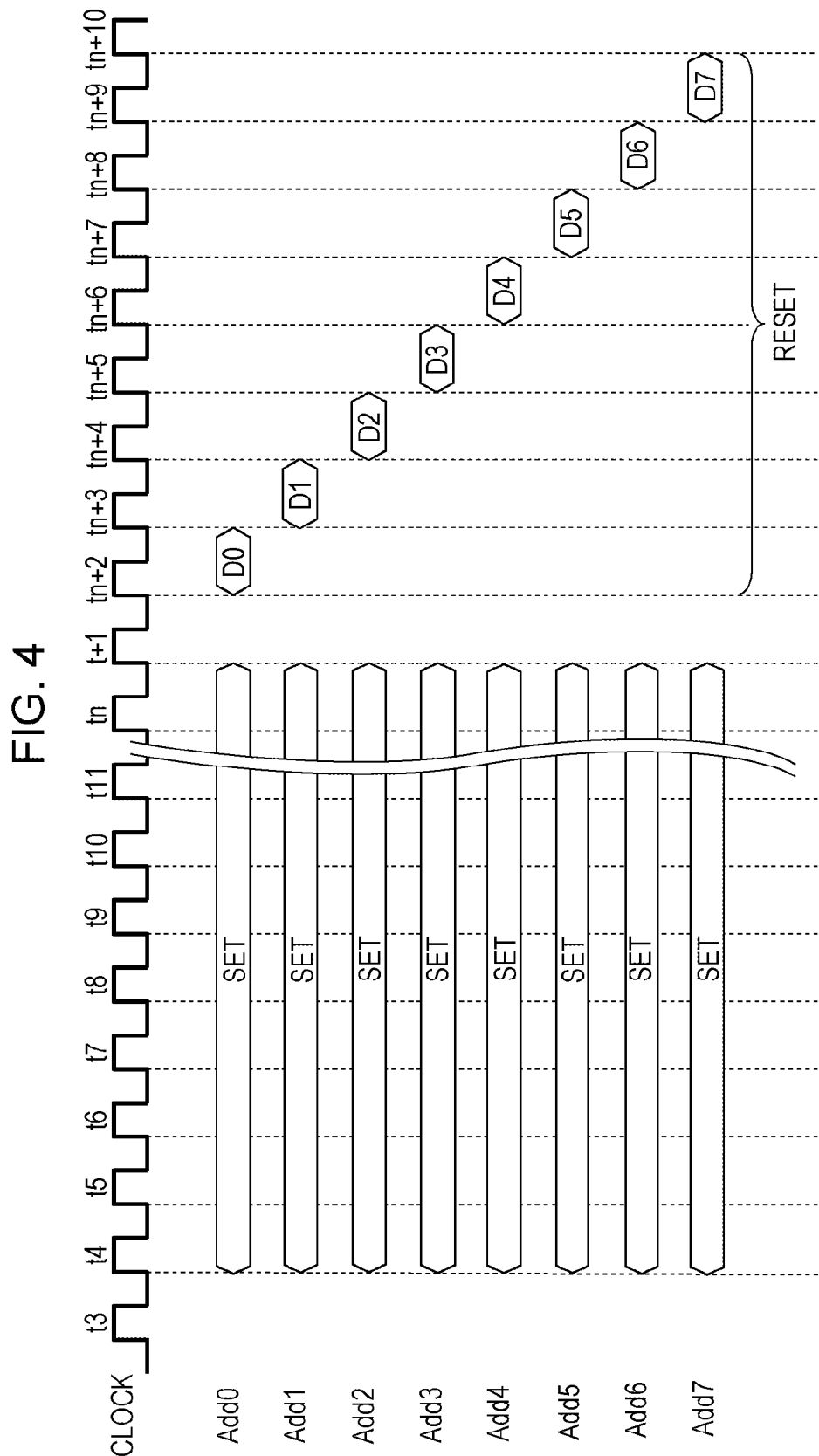

SEMICONDUCTOR MEMORY DEVICE

CROSS REFERENCE TO RELATED APPLICATION

This Nonprovisional application claims priority under 35 U.S.C. §119(a) on Patent Application No. 2012-173091 filed in Japan on Aug. 3, 2012 the entire contents of which are hereby incorporated by reference.

BACKGROUND OF THE INVENTION

1. Field of the Invention

The present invention relates to non-volatile semiconductor devices for storing information using non-volatile variable resistance elements, and more specifically to a semiconductor memory device which allows efficient writing and erasing of data and a control method for the semiconductor memory device.

2. Description of the Related Art

In recent years, there have been proposed high-speed operable next-generation non-volatile random access memory (NVRAM) devices that might replace flash memories and that have various device structures, such as a ferroelectric RAM (FeRAM), a magnetic RAM (MRAM), and an ovonic unified memory (OUM), and there is fierce development competition to increase performance and reliability, reduce cost, and enhance process consistency. However, the current memory devices described above have their merits and demerits, and the developers are facing many difficulties in realizing ideal "universal memory" combining the respective benefits of static RAM (SRAM), dynamic RAM (DRAM), and flash memory.

Instead of the existing technologies described above, resistive non-volatile memory (or resistive random access memory (RRAM (registered trademark))) devices including a variable resistance element having an electrical resistance that reversibly changes in response to the application of a voltage pulse have been proposed. The structure of the variable resistance element is very simple. As indicated in an example illustrated in FIG. 8, a variable resistance element 10 has a structure in which a lower electrode 11, a variable resistor 12, and an upper electrode 13 are stacked in this order from bottom to top and in which an electrical stress such as a voltage pulse is applied between the upper electrode 13 and the lower electrode 11 to provide reversible changes in resistance value. A resistance value in the reversible resistance changing operation (hereinafter referred to as a "switching operation," if necessary) is read, thereby making a novel non-volatile memory device feasible.

The variable resistor 12 may be formed of a perovskite material known for having a colossal magnetoresistance effect, and a method for applying a voltage pulse to a perovskite material to reversibly change the electrical resistance is disclosed in U.S. Pat. No. 6,204,139, issued to Shangquing Liu, Alex Ignatiev, et al., University of Houston, Houston, Tex. (US), and by Baek, I. G., et al., in "Highly Scalable Non-volatile Resistive Memory using Simple Binary Oxide Driven by Asymmetric Unipolar Voltage Pulses," IEDM2004, pp. 587-590, 2004. In the element structure illustrated by way of example in U.S. Pat. No. 6,204,139, the variable resistor 12 is formed of a film of crystalline praseodymium calcium manganese oxide $Pr_{1-x}Ca_xMnO_3$ (PCMO), which is a perovskite-type oxide. In addition, as known from the above-described non-patent literature, films of transition metal oxides, namely, hafnium oxide ($HfO_2$), titanium oxide ($TiO_2$), nickel oxide (NiO), zinc oxide (ZnO), and niobium oxide ($Nb_2O_5$), also exhibit a reversible resistance change.

The use of, particularly, a binary metal oxide facilitates miniaturization since a material available in the existing semiconductor production line can be used, and therefore provides an advantage of low-cost manufacturing. In order to implement a desired switching operation through the use of such binary metal oxide, a thin metal oxide film is sandwiched between metal electrodes, and the structure of the variable resistance element is made asymmetric such that an ohmic junction or the like is formed at the interface between one of the metal electrodes and the oxide film and a state where gaps occur for conductive carriers, for example, a Schottky junction, is formed at the interface between the other metal electrode and the oxide film. The structure described above allows the variable resistance element to exhibit a transition between a high-resistance state and a low-resistance state in response to the application of voltage pulses having different polarities, thereby implementing desired bipolar switching.

The non-volatile semiconductor memory device described above includes a memory cell array including a plurality of memory cells arranged in a matrix in the row direction and the column direction, each memory cell including a variable resistance element, and a peripheral circuit that controls the writing, erasing, and reading of data with respect to the respective memory cells in the memory cell array. Examples of the memory cells include, depending on their composition, a memory cell (referred to as a "1T-1R memory cell") including one selection transistor T and one variable resistance element R, a memory cell (referred to as a "1D-1R memory cell") including one diode D and one variable resistance element R, and a memory cell (referred to as a "1R memory cell") including one variable resistance element R.

It is said that a variable resistance element including binary metal oxide, such as hafnium oxide, described above, undergoes resistance switching in accordance with the opening and closing of a conductive path (hereinafter referred to as a "filament path", if necessary) of oxygen defects, which is in the form of a filament in an oxide film. The filament path is formed as a result of a soft breakdown by the limitation of electric current during dielectric breakdown through the application of voltage called forming. Therefore, the smaller the thickness of the filament path is, the smaller the amount of electric current required for the opening and closing of the filament path which causes the change in resistance, that is, the amount of electric current required for the resistance switching, is.

In order to switch the variable resistance element described above to the high-resistance state, a voltage pulse is applied so that the electrode with a larger work function among the two electrodes has a positive polarity. Thus, the oxygen ions in the film diffuse toward the electrode having a larger work function due to the internal electric field, and Joule heat is generated by the electric current flowing through the filament path, resulting in the migration of oxygen ions in the oxygen defects formed by diffusion or the migration of oxygen ions in the oxide layer around the filament into the filament path. As a result, it is considered that the oxygen defects of the filament disappear and the resistance of the filament increases.

In the case of switching to the low-resistance state, in contrast, a voltage pulse is applied so that the electrode with a larger work function has a negative polarity, thereby generating oxygen defects in the filament path. In this case, the electric current flowing in the variable resistance element is limited by a transistor or the like, thereby forming a low-resistance stable filament path. The lower limit of the electric current required for the opening and closing of the filament path is generally reduced to approximately 100 μA to 200 μA.

In actuality, the variable resistance element including metal oxide described above is applied to a large-capacity semiconductor memory device, by using state-of-the-art miniaturization and processing technology. To this end, it is desirable that data held in the variable resistance element be rewritten or read with the drive capability of a miniature transistor produced using state-of-the-art processing.

In a transistor produced using state-of-the-art miniaturization and processing technology, the on-resistance of the transistor increases, the electric current driving capability decreases, and the driving voltage decreases in accordance with the scaling law. There are currently demands for changes in the resistance state of the element under a writing condition of a voltage as low as approximately 1 V and an electric current as low as several tens of microamperes, and there is also a demand for a further reduction in the electric current required for the opening and closing of the filament path. This implies that, assuming that an electric current of 10 μA flows when a voltage of 1 V is applied in order to change the resistance from the low-resistance state to the high-resistance state, the resistance value in the low-resistance state needs to be set to 100 kΩ if a voltage-current characteristic in the low-resistance state is linear.

Furthermore, the resistance state of the variable resistance element is read by reading the resistance value while the transistor and the variable resistance element are connected in series. For this reason, the reading sensitivity is impaired and difficulties occur in reading unless the resistance value of the variable resistance element in the low-resistance state is set sufficiently higher than the on-resistance of the transistor. However, the higher the resistance value of the variable resistance element in the low-resistance state, the smaller the read margin between the resistance value of the variable resistance element in the low-resistance state and the resistance value thereof in the high-resistance state. For example, assuming that the lower limit value of the reading current that can be sensed using a sense amplifier is 1 μA, the resistance value in the low-resistance state has an upper limit of 100 kΩ if the reading voltage is 0.1 V. The on-resistance of the series-connected transistor is difficult to read unless the on-resistance is set lower than at least the upper limit of the resistance value of the variable resistance element in the low-resistance state.

In the operation of rewriting the variable resistance element from the high-resistance state to the low-resistance state (hereinafter referred to as the "set operation", if necessary), a voltage of a certain value or more and an electric current of a certain value or more, which are enough to break the bonds between metal and oxygen in the metal oxide, are applied to induce the movement of oxygen in the manner described above, and oxygen vacancies are formed through the metal oxide to form a filament path. In this case, a reduction in the amount of voltage and electric current applied in the set operation or the time during which electric current flows may cause incomplete movement of oxygen, resulting in a discontinuous filament path being formed. This increases the resistance. This mechanism is similar to that in a soft dielectric breakdown (hereinafter referred to as a "soft breakdown") of a silicon oxide film of several nanometers. It is considered that a thin oxide film composed of metal and oxygen still have the mechanism described above although the amount of electric current required for the set operation, and the time during which electric current flows differ depending on the metal oxide material.

FIG. 9 illustrates a relationship between the pulse width ("set time") of a voltage pulse applied in the set operation and the resistance value obtained after the set operation in a memory element including a variable resistance element formed of metal oxide, namely, hafnium oxide, and a transistor.

In a case where an electric current ("set current") Iset flowing through the variable resistance element in the set operation is limited to 100 μA or less using a transistor, a resistance value of approximately 20 kΩ after the set operation is obtained even though the set time is reduced to 100 ns. As the set current is limited to a lower electric current, the resistance value after the set operation is shifted to the high-resistance side. In a case where the set current Iset is limited to 40 μA or less, the resistance value after the set operation tends to increase in accordance with a decrease in the set time, and the resistance value after the set operation increases up to approximately 300 kΩ with respect to a set time of 500 ns or less. Similarly, in a case where the set current Iset is limited to 20 μA or less, the resistance value after the set operation increases up to approximately 10 MΩ with respect to a set time of 500 ns or less.

In a case where the set current Iset is larger than 100 μA, in contrast, the resistance value after the set operation is kept substantially constant regardless of the set time. It is found that the larger the voltage amplitude of the voltage pulse, the shorter the set time.

This implies that, taking into account the drive capability of a small transistor, a set time as long as 1 μs or more may be required to stably control the resistance value after the set operation at approximately 100 kΩ with a set current of several tens of microamperes.

On the other hand, the operation of rewriting the variable resistance element from the low-resistance state to the high-resistance state (hereinafter referred to as the "reset operation", if necessary) does not cause a reduction in operation speed. As described above, the reset operation is caused by the Joule heat generated by the passage of an electric current through the filament path whose resistance has been converted to a low resistance. Thus, the smaller the set current is, the narrower the filament path to be formed is, resulting in concentration of the Joule heat generated in the filament path. Accordingly, desired Joule heat may be obtained with a smaller amount of electric current. For example, in the element including hafnium oxide, described above, the resistance of a filament path in a low-resistance state of 100 kΩ is converted to a high resistance up to several tens of mega ohms to several hundreds of mega ohms by the passage of an electric current of several tens of microamperes through the filament path for a time of several tens of nanoseconds.

As a result, the feature that has been perceived as an advantage of a resistance-change memory, in which it is possible to perform rewriting in response to the application of a high-speed pulse voltage with random access for several tens of nanosecond, is lost in a large-capacity semiconductor memory device suitable for state-of-the-art miniaturization and processing technology. Such a semiconductor memory device takes a time of 1 μs or longer to perform the set operation, resulting in a reduction in rewriting speed.

SUMMARY OF THE INVENTION

Accordingly, in some aspects, the present invention provides a method for efficiently rewriting a variable resistance element including metal oxide in a low-voltage and low-current operation, and a low-power consumption, large-capacity semiconductor memory device including the variable resistance element.

In an aspect of the present invention, a semiconductor memory device includes a memory cell array and a control circuit. The memory cell array includes a plurality of memory cells arranged in at least one of a row direction and a column direction. Each of the plurality of memory cells has a variable resistance element including a first electrode and a second electrode, and a selection transistor. One of the first electrode and the second electrode of the variable resistance element is connected to one of input and output terminals of the selection transistor. The variable resistance element further includes a variable resistor that includes metal oxide between the first electrode and the second electrode such that an electrical resistance between the first electrode and the second electrode changes in accordance with application of an electrical stress between the first electrode and the second electrode, thereby storing information in the semiconductor memory device. The control circuit is configured to control a reset operation and a set operation. The reset operation is an operation of applying a reset voltage pulse having a first polarity to ends of a memory cell among the memory cells to convert an electrical resistance between the first electrode and the second electrode of the variable resistance element of the memory cell to a high resistance in a high-resistance range. The set operation is an operation of applying a set voltage pulse having a second polarity opposite to the first polarity to ends of a memory cell among the memory cells to convert an electrical resistance between the first electrode and the second electrode of the variable resistance element of the memory cell to a low resistance in a low-resistance range. The control circuit is configured to, in the set operation, apply a certain voltage to a control terminal of the selection transistor of the memory cell to limit an upper limit of a set current flowing between the first electrode and the second electrode to a low electric current, and perform control, while limiting the upper limit of the set current to the low electric current, to apply the set voltage pulse to the plurality of memory cells for a longer time than a time during which the reset voltage pulse is applied in the reset operation.

Preferably, in the reset operation, the time during which the reset voltage pulse is applied is set shorter than a minimum time during which the set voltage pulse is applied, which is required for an electrical resistance between the first electrode and the second electrode after application of the set voltage pulse to be in the low-resistance range to perform the set operation while limiting the upper limit of the set current to the low electric current. Therefore, a high-speed operation may be performed.

Preferably, in a case where the set voltage pulse is applied to ends of the memory cell in the set operation while the set current is limited, the variable resistance element has a characteristic in which an electrical resistance between the first electrode and the second electrode after the set operation changes to a high-resistance side as the upper limit of the set current decreases and in which an electrical resistance between the first electrode and the second electrode after the set operation changes to the high-resistance side as the time during which the set voltage pulse is applied is reduced.

Preferably, in the reset operation, the reset voltage pulse is applied without limiting, using the selection transistor, a reset current flowing between the first electrode and the second electrode of the variable resistance element of the memory cell.

Preferably, the memory cell array is configured such that the memory cells are arranged in at least in the column direction, and the control terminals of the selection transistors of memory cells arranged in same column are mutually connected to a word line extending in the column direction. Furthermore, preferably, the set operation is a simultaneous set operation that is an operation of simultaneously applying the set voltage pulse to a first group of memory cells including a plurality of adjacent memory cells in the column direction in which the control terminals of the selection transistors are connected to the same word line.

Preferably, the control circuit controls a sequential reset operation after the simultaneous set operation. The sequential reset operation is an operation of selecting a second group of memory cells including one or more memory cells to be reset from among the first group of memory cells, and sequentially executing the reset operation on the one or more memory cells in the second group of memory cells.

Preferably, the memory cell array is divided into a plurality of banks each including the plurality of memory cells, and the simultaneous set operation for the plurality of memory cells in one of the plurality of banks and the sequential reset operation for a memory cell in another of the plurality of banks are executed in parallel in an identical operation cycle.

Preferably, the control circuit controls a verifying operation after the simultaneous set operation and before the sequential reset operation. The verifying operation is an operation of reading resistance states of the variable resistance elements of all memory cells to which the set voltage pulse is applied, again selecting a memory cell for which an electrical resistance between the first electrode and the second electrode of the variable resistance element is not in the low-resistance range, and performing the set operation on the selected memory cell.

Preferably, the control circuit controls a forming operation before executing the set operation and the reset operation. The forming operation is an operation of applying an electrical stress between the first electrode and the second electrode of a variable resistance element that is in an initially high-resistance state to convert the electrical resistance between the first electrode and the second electrode to a low resistance.

Preferably, each of the selection transistors has an on-resistance lower than at least an upper limit of the low-resistance range. More preferably, the on-resistance of each of the selection transistors is in a range of 10 k$\Omega$ or more to 100 k$\Omega$ or less. Therefore, a semiconductor memory device with high reading sensitivity and a large read margin may be achieved.

Preferably, the low-resistance range has an upper limit less than or equal to 100 k$\Omega$, and the high-resistance range has a lower limit greater than or equal to 1 M$\Omega$. Therefore, a semiconductor memory device having a resistance change ratio (the ratio of a resistance value in a high-resistance state to a resistance value in a low-resistance state) that is ten times or more larger than that in an existing semiconductor memory device and capable of facilitating the reading operation may be achieved.

According to an aspect of the present invention, simultaneously performing the set operation on a plurality of memory cells may substantially reduce the issue of a reduction in operation speed which is caused by taking a certain amount of time to perform the set operation. The set operation performed with the limitation of a set current to a certain value or less may not lead to a reduction in the rewriting operation speed even though the application of a set voltage pulse for a short time is insufficient for conversion to a low resistance. Conversion to a low resistance may be performed by applying the set voltage pulse for a long time.

The semiconductor memory device may be configured such that, for example, in the set operation, a plurality of bits are connected to the same word line and the resistances of memory cells that are connected to adjacent bit lines and whose addresses are consecutive are simultaneously converted to low resistances, whereas, in the reset operation, the resistance of only a desired memory cell is converted to a high resistance.

Therefore, a low-power-consumption, high-capacity semiconductor memory device capable of performing low-voltage and low-current rewriting without reducing the rewriting operation speed may be achieved.

BRIEF DESCRIPTION OF THE DRAWINGS

FIG. 4 is a timing chart illustrating an example of a rewriting operation method according to the present invention;

DESCRIPTION OF THE PREFERRED EMBODIMENTS

First Embodiment

Figure 1:
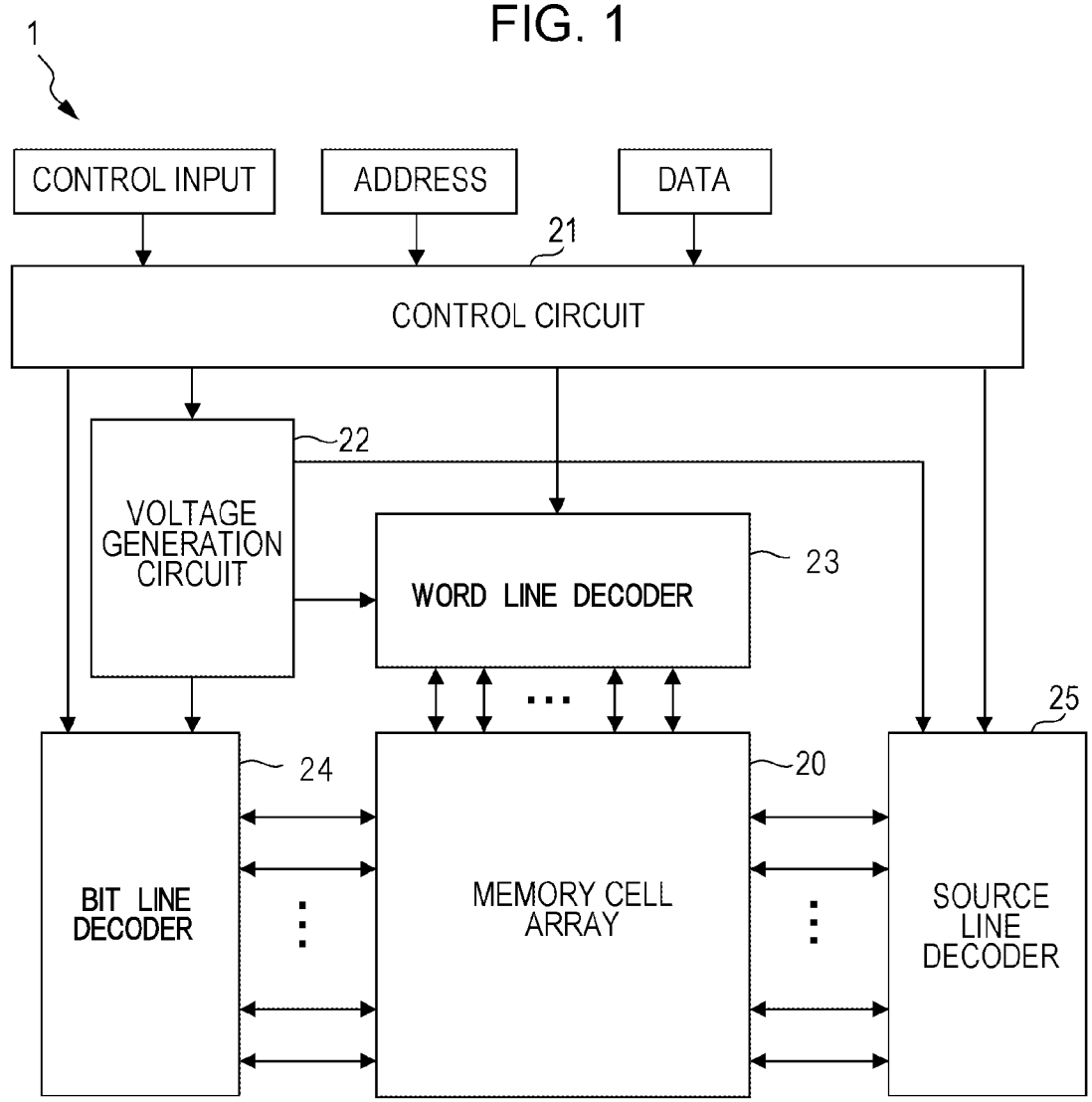
FIG. 1 is a circuit block diagram illustrating a schematic configuration of a semiconductor memory device according to an embodiment of the present invention.

FIG. 1 illustrates a circuit block diagram illustrating a schematic configuration of a semiconductor memory device according to an embodiment of the present invention. Referring to FIG. 1, a semiconductor memory device 1 includes a memory cell array 20, a control circuit 21, a voltage generation circuit 22, a word line decoder 23, a bit line decoder 24, and a source line decoder 25.

Figure 2:
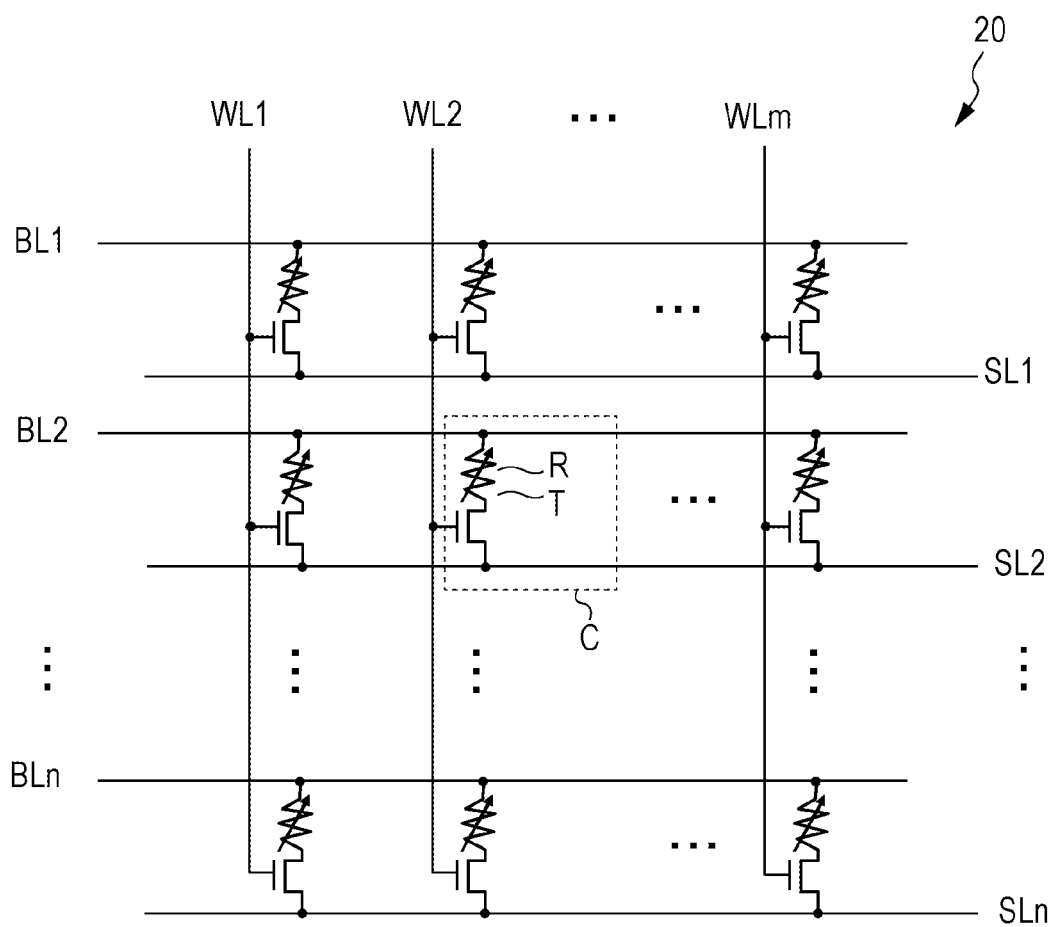
FIG. 2 is a circuit diagram illustrating an example of a configuration of a memory cell array.

FIG. 2 illustrates an example of a circuit configuration of the memory cell array 20. As illustrated in FIG. 2, the memory cell array 20 has a plurality of memory cells C arranged in row and column directions. Each of the memory cells C has a pair of input and output terminals (hereinafter referred to as an "input-output terminal pair") in which a variable resistance element R and a selection transistor T are connected in series. In the respective memory cells C, first ends on the variable resistance element R side of the input-output terminal pairs are connected to a plurality of bit lines BL1 to BLn extending in the row direction (the horizontal direction in FIG. 2) (n is a natural number greater than or equal to 2), and second ends on the selection transistor T side of the input-output terminal pairs are connected to source lines SL1 to SLn also extending in the row direction. Further, control terminals of the selection transistors T of the respective memory cells C are connected to one or more word lines WL1 to WLm (m is a natural number) extending in the column direction (the vertical direction in FIG. 2).

Figure 8:
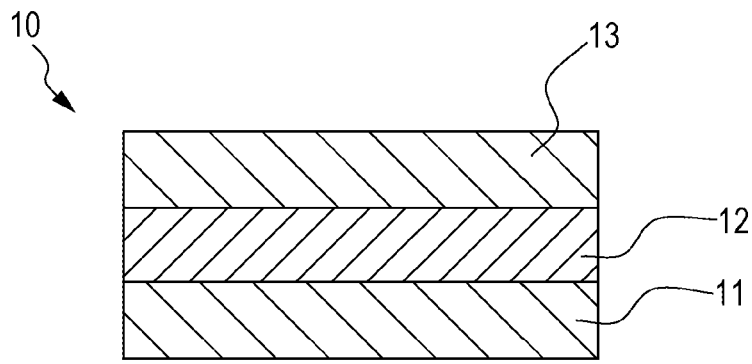
FIG. 8 is a schematic cross-sectional view illustrating an example of a structure of a variable resistance element.

Each of the variable resistance elements R is an element having a first electrode and a second electrode with a variable resistor containing a metal oxide material formed therebetween, and has a characteristic in which the electrical resistance between the first and second electrodes changes in response to the application of an electrical stress between the first and second electrodes. Each of the variable resistance elements R may be configured as, for example, an element having the structure illustrated in FIG. 8 in which the variable resistor 12 is interposed between the upper electrode (first electrode) 13 and the lower electrode (second electrode) 11. However, the structure of the variable resistance elements R is not limited thereto. Each of the variable resistors may be formed of a material including, for example, an oxide or oxynitride of an element selected from hafnium (Hf), titanium (Ti), nickel (Ni), vanadium (V), zirconium (Zr), tungsten (W), cobalt (Co), aluminum (Al), zinc (Zn), iron (Fe), and copper (Cu). However, the material of the variable resistors is not limited thereto. As described above, any element that allows changes in electrical resistance between first and second electrodes in accordance with the application of an electrical stress between the first and second electrodes may be used regardless of its element structure and material.

In a case where, as described above, a variable resistance element includes a variable resistor of metal oxide or metal oxynitride, the variable resistance element that is in an initial state immediately after manufacture is brought into a state (variable resistance state) where the variable resistance element is switchable between a high-resistance state and a low-resistance state in response to electrical stress, by applying a voltage pulse having a larger voltage amplitude and a larger pulse width than a voltage pulse generally used for a rewriting operation to the variable resistance element before use and by forming in a resistance change layer a current path (or filament path) in which resistance switching is to occur. This voltage application process is called a forming process. Accordingly, a conductive path in which a local increase in the density of the current flowing through the variable resistor 12 occurs is formed.

As is known in the art, the filament path formed in the forming process defines the electrical characteristics of the element later. It is also considered that the filament path appears or disappears due to the gathering or diffusing of oxygen atoms induced by electric fields near the interfaces between the electrodes and the variable resistor, resulting in a resistance change.

Further, it is considered that a resistance change occurs at the interface having high-potential-barrier between high-work-function electrode and the metal oxide or metal oxynitride. Therefore, it is desirable that one of the first electrode and the second electrode be formed of a high-work-function conductive material to form a Schottky junction with the variable resistor, and the other electrode be formed of a low-work-function conductive material to form an ohmic junction with the variable resistor. This configuration allows stable resistance switching of the variable resistance element R, as is known in the art. Specifically, in a case where the second electrode has a higher work function than the first electrode, preferably, the first electrode is formed of a material selected from conductive materials having a work function lower than 4.5 eV (such as Ti, Ta, Hf, and Zr), and the second electrode is formed of a material selected from conductive materials having a work function greater than or equal to 4.5 eV (such as Pt, TiN, Ru, $RuO_2$, and Indium Tin Oxide (ITO)).

In this embodiment, furthermore, a voltage pulse whose polarity is opposite depending on a change to a low-resistance state or to a high-resistance state is applied to the memory cells C including the variable resistance elements R, thereby rewriting the memory cells C.

In order to rewrite a memory cell selected as an object to be operated (hereinafter referred to as a "selected memory cell", if necessary) in the memory cell array 20, a voltage is applied to the word line connected to the selected memory cell for selection, and a certain voltage is applied to the bit line and the source line that are connected to the selected memory cell so that a certain rewriting voltage is applied to the ends of the selected memory cell. In a reset operation for converting the resistance of the variable resistance element R to a high resistance, a certain voltage is applied to the bit line and the source line that are connected to the selected memory cell so that a reset voltage pulse having a first polarity is applied to the ends of the selected memory cell, thereby converting the electrical resistance of the variable resistance element R in the selected memory cell to a high resistance in a certain high-resistance range. In a set operation for converting the resistance of the variable resistance element R to a low resistance, in contrast, a certain voltage is applied to the bit line and the source line that are connected to the selected memory cell so that a set voltage pulse having a second polarity opposite to the first polarity is applied to the ends of the selected memory cell, thereby converting the electrical resistance of the variable resistance element R in the selected memory cell to a low resistance in a certain low-resistance range.

In this case, the set operation is performed while the amount of electric current flowing through the variable resistance element R in the selected memory cell is limited to a certain low electric current by the selection transistor T. This may reduce the width of the filament path to be formed, and may reduce the variation of the resistance value in the low-resistance state. In the set operation, therefore, a certain voltage that allows the transistor T to limit the amount of electric current is applied to the word line connected to the selected memory cell.

In the reset operation, in contrast, the amount of electric current flowing through the variable resistance element R in the selected memory cell may not necessarily be limited. On the contrary, no limitation in the amount of electric current may increase the operation speed. In the reset operation, therefore, it is desirable that a certain high voltage be applied to the word line connected to the selected memory cell so that the electric current may not be limited by the transistor T.

The control circuit 21 controls the memory operations for rewriting (set operation and reset operation) and reading a selected memory cell in the memory cell array 20, and also controls the forming process. Specifically, the control circuit 21 controls the word line decoder 23, the bit line decoder 24, and the source line decoder 25 in accordance with an address signal input from an address line, a data input signal input from a data line, and a control input signal input from a control signal line, and controls the memory operations and the forming process for the corresponding memory cell. In the example illustrated in FIG. 1, the control circuit 21 has general functions of an address buffer circuit, a data input/output buffer circuit, and a control input buffer circuit, which are not illustrated.

The voltage generation circuit 22 generates a selected-word-line voltage and an unselected-word-line voltage that are required to select the memory cell to be operated in the memory operations of rewriting and reading and the forming process, and supplies the generated selected-word-line voltage and unselected-word-line voltage to the word line decoder 23. The voltage generation circuit 22 further generates a selected-bit-line voltage and an unselected-bit-line voltage, and supplies the generated selected-bit-line voltage and unselected-bit-line voltage to the bit line decoder 24. The voltage generation circuit 22 also generates a selected-source-line voltage and an unselected-source-line voltage, and supplies the generated selected-source-line voltage and unselected-source-line voltage to the source line decoder 25.

When the address of the memory cell to be operated is specified in accordance with an address signal input to the address line in the memory operations of rewriting and reading and the forming process for the memory cell, the word line decoder 23 selects the word line corresponding to the memory cell specified by the address signal input to the address line, and applies the selected-word-line voltage and the unselected-word-line voltage to the selected word line and the unselected word lines, respectively.

When the address of the memory cell to be operated is specified in accordance with an address signal input to the address line in the memory operations of rewriting and reading and the forming process for the memory cell, the bit line decoder 24 selects the bit line corresponding to the memory cell specified by the address signal input to the address line, and applies the selected-bit-line voltage and the unselected-bit-line voltage to the selected bit line and the unselected bit lines, respectively.

When the address of the memory cell to be operated is specified in accordance with an address signal input to the address line in the memory operations of rewriting and reading and the forming process for the memory cell, the source line decoder 25 selects the source line corresponding to the memory cell specified by the address signal input to the address line, and applies the selected-source-line voltage and the unselected-source-line voltage to the selected source line and the unselected source lines, respectively.

The semiconductor memory device 1 further includes a reading circuit (not illustrated), and is configured to determine whether the variable resistance element R in the selected memory cell is in the high-resistance state or the low-resistance state by detecting an electric current flowing through the variable resistance element R in the selected memory cell in response to the application of a reading voltage in a reading operation.

Figure 3:
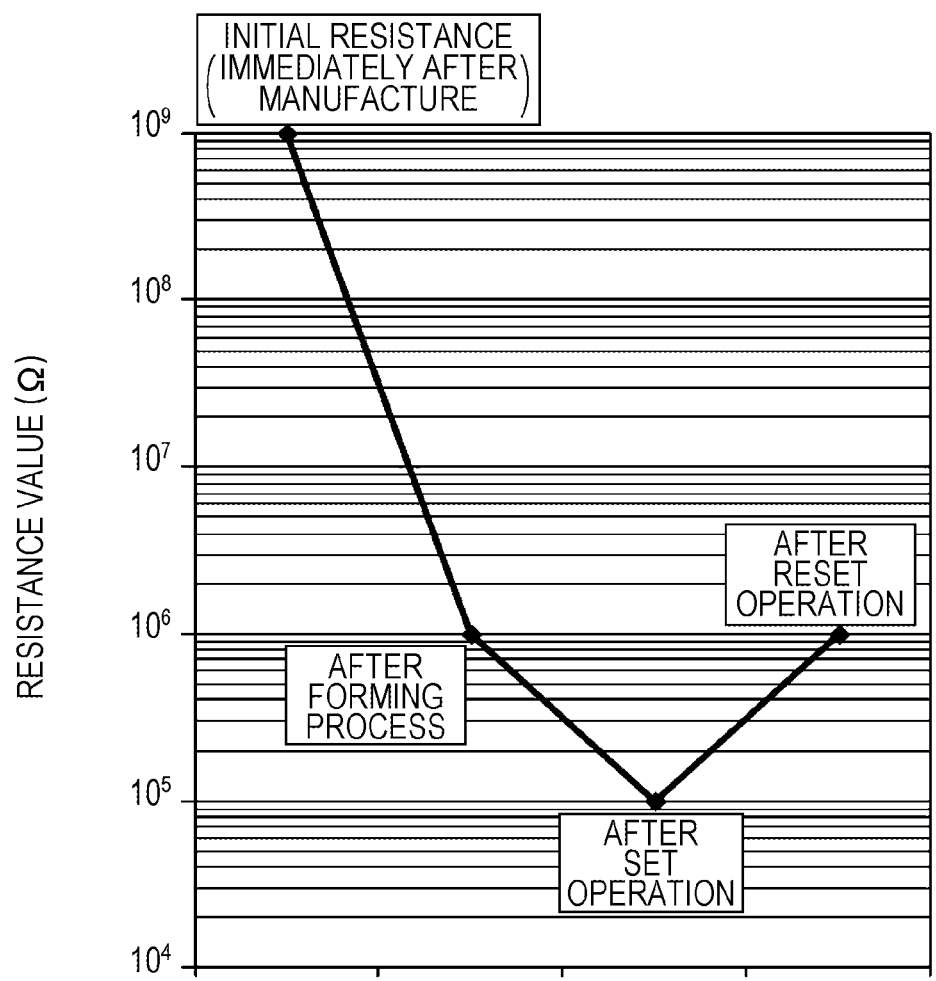
FIG. 3 is a graph illustrating a change in the resistance value of a variable resistance element.

A description will now be given of a high-speed rewriting (set operation and reset operation) method in a case where each of the variable resistance elements R is an element including a hafnium oxide film as a metal oxide film, an upper electrode of Ta, and a lower electrode of TiN. FIG. 3 illustrates a change in the resistance value of a variable resistance element having the configuration described above after the forming process, after the set operation, and after the reset operation.

First, a forming voltage of 1 V to 1.5 V is applied to the memory cell array 20 immediately after manufacture from a selected bit line while the source lines are driven to a ground, and the voltage on the word line connected to the control terminal of the selection transistor T of the selected memory cell is controlled so that an electric current up to 20 μA flows through the selection transistor T of the selected memory cell. The variable resistance element R before the forming process has a resistance value as high as several giga ohms, and most of the forming voltage is applied to the variable resistance element R. Substantially no electric current flows through the variable resistance element R. The limitation of electric current by the selection transistor T allows a filament path to be formed as a result of a soft breakdown.

If a filament path is formed in the forming process, as illustrated in FIG. 3, the resistance of the variable resistance element is converted from an initial resistance greater than or equal to 1 GΩ to a resistance as low as 1 MΩ after forming. The set operation is further performed, and a set voltage pulse (here, 2.5 V) is applied to the selected memory cell through the selected bit line while the voltage on the word line connected to the control terminal of the selection transistor T of the selected memory cell is controlled so that an electric current up to 40 μA flows through the selection transistor T, thereby converting the resistance of the variable resistance element R to a low resistance in a low-resistance range of 80 kΩ to 100 kΩ.

After that, the reset operation is performed, and a reset voltage pulse (here, 1.6 V) is applied to the selected memory cell through a selected source line while the voltage on the word line connected to the control terminal of the selection transistor T is controlled so that the selection transistor T does not limit electric current flow, thereby converting the resistance of the variable resistance element R to a high resistance in a high-resistance range greater than or equal to 1 MΩ.

In this case, the reset operation may be performed at a high speed by applying a reset voltage pulse of 1.6 V to the selected memory cell for a time of 20 to 50 ns.

Figure 9:
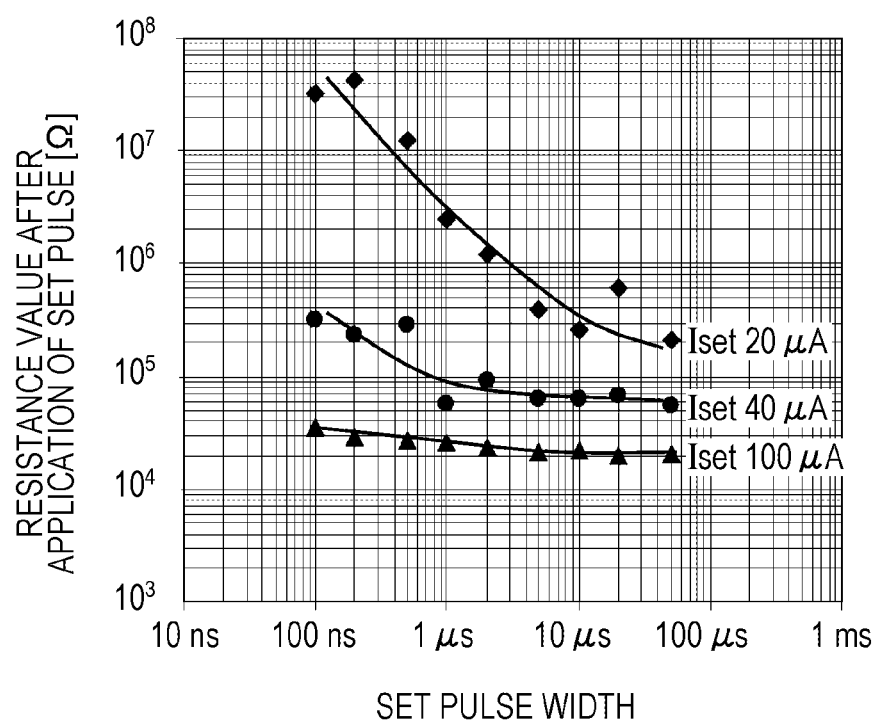
FIG. 9 is a graph illustrating the operational characteristics of the variable resistance element, which illustrates a relationship between the time (pulse width) during which a set voltage pulse is applied in a set operation (conversion to a low resistance) and a resistance value after the set operation.

However, if the set operation is performed by applying a set voltage pulse for a time of 20 to 50 ns in a manner similar to that in the reset operation, as seen from FIG. 9, it is difficult for the resistance value after the set operation to fall within a low-resistance range of 80 kΩ to 100 kΩ so long as the set current is limited to 40 μA or less. The resistance value after the set operation is kept in a middle-resistance range of 100 kΩ to 1 MΩ between a low-resistance state and a high-resistance state, or, for worse, kept in a high-resistance range greater than or equal to 1 MΩ, and it is difficult to convert the resistance of the variable resistance element R to a low resistance. As seen from FIG. 9, the application of a set voltage pulse for a time as long as approximately 2 μs or more will be taken to make the resistance value after the set operation fall within a low-resistance range of 80 kΩ to 100 kΩ. In the following description, a minimum time during which the set voltage pulse is applied, which is required for the resistance value after the set operation to be in a low-resistance range is referred to as a "minimum set time".

In the semiconductor memory device 1 according to this embodiment, a set voltage pulse is applied for a time longer than or equal to the minimum set time described above (in the example described above, approximately 2 μs) while the voltage to be applied to the word line connected to the selected memory cell is controlled so that the electric current flowing through the selection transistor T of the selected memory cell is up to 40 μA. In the meantime, the set voltage pulse is also applied to a plurality of adjacent selected memory cells (first group of memory cells) connected to the same word line to reduce the time required for the set operation per memory cell. In the following description, the operation of simultaneously applying a set voltage pulse to a plurality of selected adjacent memory cells is referred to as a "simultaneous set operation".

For example, the simultaneous set operation is performed on a 64-bit variable resistance element to reduce the time required for the set operation per bit to about 16 ns to facilitate a reduction to be substantially equal to the time during which the reset voltage pulse is applied. After the completion of the simultaneous set operation, one or more memory cells (second group of memory cells) that need to undergo the reset operation are selected, and a reset voltage pulse is applied to the selected memory cell or cells one by one, or sequentially. The time during which the reset voltage pulse is applied (in the example described above, 20 to 50 ns) is much shorter than the minimum set time described above. Such an operation described above including a series of operations of selecting one or more memory cells that are to undergo the reset operation from a plurality of adjacent memory cells and applying a reset voltage pulse to the selected memory cell or cells one by one, or sequentially, is referred to as a "sequential reset operation".

FIG. 4 illustrates an example of a timing chart in a case where the semiconductor memory device 1 performs the simultaneous set operation and the sequential reset operation. The execution of the simultaneous set operation and the sequential reset operation is controlled by the control circuit 21 of the semiconductor memory device 1. In FIG. 4, an example is illustrated in which eight pieces of writing data (with a burst length of 8) are consecutively written using the burst function. In FIG. 4, each of clock cycles t3 to t11 and tn to tn+10 begins at a rising clock edge.

The semiconductor memory device 1 according to this embodiment starts the simultaneous set operation and the sequential reset operation in response to: the top address Add0 of the memory cell to be rewritten being input to the control circuit 21 through the address line; rewriting data items D0 to D7 being input to the control circuit 21 through the data line; and a rewrite command being input to the control circuit 21 through the control signal line. In the clock cycles t4 to tn, the simultaneous set operation (SET) is performed on the consecutive memory cells corresponding to addresses Add0 to Add7 connected to the same word line. In the clock cycles tn+2 to tn+9, a reset voltage pulse is sequentially applied to the respective memory cells corresponding to the addresses Add0 to Add7 for different clock cycles. That is, the sequential reset operation (RESET) is executed.

In the example in FIG. 4, the variable resistance elements of all the memory cells corresponding to the addresses Add0 to Add7 are converted to high resistances using the reset operation. In the sequential reset operation, in contrast, it may only be required to select a memory cell that needs to undergo the reset operation in accordance with the rewriting data items D0 to D7 and to apply a reset voltage pulse to the selected memory cell or cells, whereas the reset voltage pulse may not necessarily be applied to a memory cell in which the variable resistance element is kept at a low-resistance state.

In FIG. 4, the consecutive writing of 8-bit writing data items D0 to D7 is illustrated by way of example. The larger the number of data bits (burst length) to be consecutively written, the shorter the time required for the set operation per memory cell, resulting in an expectation of a high-speed operation.

In this manner, after the simultaneous set operation is performed on a plurality of memory cells, a memory cell that needs to undergo the reset operation (conversion to a high resistance) is selected and the sequential reset operation is performed on the selected memory cell or cells. This enables an increase in the speed of the rewriting operation. Therefore, a low-power-consumption, high-capacity semiconductor memory device capable of performing low-voltage and low-current rewriting without reducing the rewriting operation speed may be achieved.

Second Embodiment

In the first embodiment, a description has been given of a method for reducing the time required for the set operation per memory cell by executing the set operation by applying a set voltage pulse to a selected memory cell for a long time while the set voltage pulse is applied simultaneously to a plurality of selected memory cells, thereby substantially reducing the time required for rewriting. It is still more preferable that the time during which the set voltage pulse is applied be shorter.

As the time during which the set voltage pulse is applied is reduced, however, the resistance value of a variable resistance element after the set operation is deviated from the low-resistance range, and the number of elements for which the set operation has failed increases.

The duration of the set operation may be reduced by, after the set operation, reading the resistance states of the variable resistance elements of selected memory cells and performing the set operation again on a memory cell for which it is determined that a set operation failure has occurred. This effect will be described in more detail hereinafter. The operation of determining the occurrence of a set operation failure and performing the set operation again on an element for which it is determined that a set operation failure has occurred will be referred to as a "verifying operation".

Figure 5A:
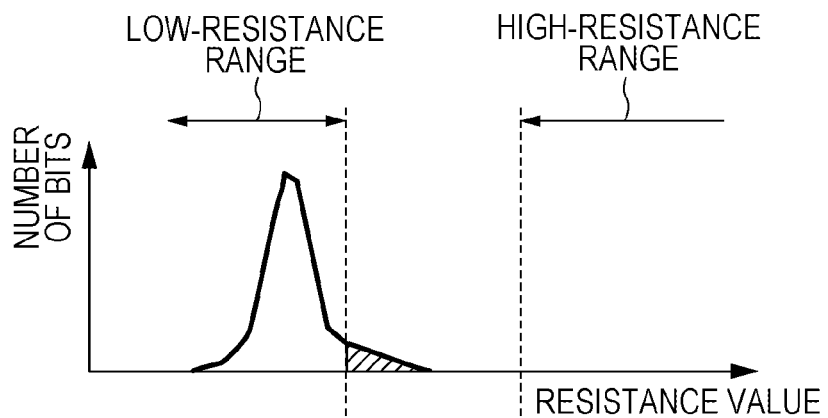
FIGS. 5A to 5C are distribution diagrams illustrating examples of the distribution of the resistance values of variable resistance elements of memory cells when the rewriting operation method according to the present invention is executed.
Figure 5B:
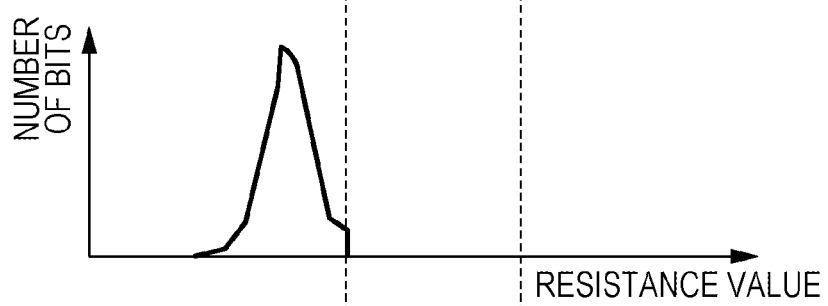
Figure 5C:
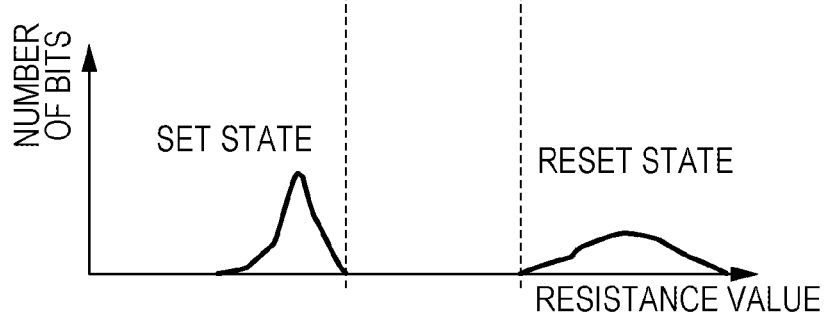

FIGS. 5A, 5B, and 5C illustrate examples of the distribution of the resistance values of the variable resistance elements of selected memory cells after the simultaneous set operation, after the verifying operation, and after the sequential reset operation, respectively.

Now the case will be considered where a set voltage pulse is applied for an application time of, for example, 500 ns in the simultaneous set operation illustrated in FIG. 4. Since the time during which the set voltage pulse is applied is not sufficiently long, as illustrated in FIG. 5A, the resistance value of the variable resistance element of the selected memory cell is not sufficiently reduced to the low-resistance range, and an element having a higher resistance than the upper limit of the low-resistance range may exist.

In this embodiment, therefore, the verifying operation is performed after the simultaneous set operation, and the resistance state of the variable resistance element of each of the respective memory cells that have undergone the simultaneous set operation is read to determine whether or not the resistance value of the variable resistance element is in the low-resistance range. A variable resistance element having a resistance value that is outside the low-resistance range (the oblique line portion in FIG. 5A) is determined to be an element for which a set operation failure has occurred.

Then, a memory cell having a variable resistance element for which it is determined that a set operation failure has occurred is selected, and the set operation is performed again on the selected memory cell. If there are a plurality of variable resistance elements for which it is determined that a set operation failure has occurred, a plurality of memory cells corresponding to the plurality of variable resistance elements may be selected and the simultaneous set operation may be performed on the selected memory cells. It is assumed here that the time during which a set voltage pulse is initially applied in the simultaneous set operation is equal to the time during which the set voltage pulse is applied in the verifying operation (here, 500 ns). Such a verifying operation is repeatedly performed until it is determined that the resistance values of the variable resistance elements of all the selected memory cells fall within the low-resistance range, thereby changing the distribution of the resistance values of the variable resistance elements in the manner illustrated in FIG. 5B.

After that, memory cells that need to undergo the reset operation are selected, and the sequential reset operation is performed on the selected memory cells. Thus, the distribution illustrated in FIG. 5C is obtained.

In the configuration described above, the time required to read the resistance states in the verifying operation (approximately 50 ns) is much shorter than that for the set operation, and does not substantially affect an increase in the set time. In addition, even though the set operation (simultaneous set operation) is executed again on the variable resistance element of a memory cell for which it is determined in the verifying operation that a set operation failure has occurred, the total time required for the set operation is approximately 1 μs, and the duration of the set operation may be reduced compared to that in the rewriting method according to the first embodiment.

Third Embodiment

Figure 6:
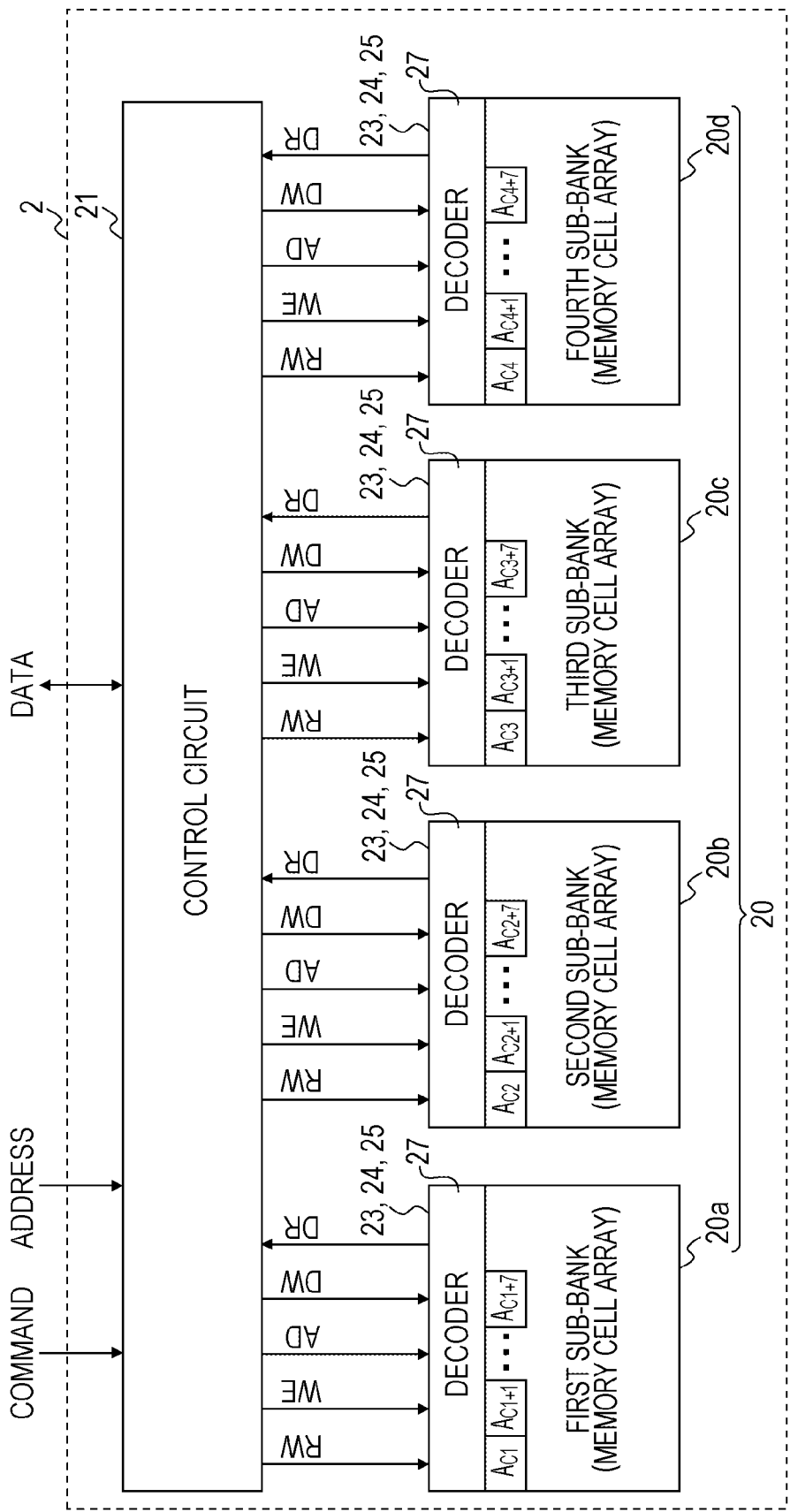
FIG. 6 is a circuit block diagram illustrating an example of memory cells in a semiconductor memory device including a plurality of banks according to an embodiment of the present invention.

In the semiconductor memory device 1, the memory cell array 20 may include a plurality of banks. FIG. 6 illustrates an example of a semiconductor memory device configured such that a memory cell array includes a plurality of banks. Referring to FIG. 6, a semiconductor memory device 2 includes a memory cell array 20 that is divided into four banks 20a to 20d. Each of the banks 20a to 20d corresponds to the memory cell array 20 of the semiconductor memory device 1, and a plurality of memory cells arranged in a matrix are connected through the word lines WL1 to WLm, the bit lines BL1 to BLn, and the source lines SL1 to SLn. Similarly to the semiconductor memory device 1, the semiconductor memory device 2 includes a control circuit 21, a voltage generation circuit 22 (not illustrated), word line decoders 23, bit line decoders 24, and source line decoders 25. In FIG. 6, for the sake of simplicity, a set of decoders including each of the word line decoders 23, each of the bit line decoders 24, and each of the source line decoders 25 is illustrated as a single decoder 27.

The control circuit 21 of the semiconductor memory device 2 controls the decoders (the word line decoder 23, the bit line decoder 24, and the source line decoder 25) in accordance with an address signal input from an address line, a data input signal input from a data line, and a control input signal input from a control signal line, and controls the memory operations and the forming process for the corresponding memory cell. Further, the control circuit 21 outputs, for each of the banks 20a to 20d, to the decoder 27 (particularly to the bit line decoder 24) a signal RW indicating which of the rewriting operation, the reading operation, and the forming process is to be performed on the selected memory cell, a signal WE indicating which bit of the data is to be subjected to the rewriting operation if the signal RW indicates the rewriting operation, a signal AD indicating an address, and a signal DW indicating writing data. The control circuit 21 further receives a signal DR indicating reading data from the decoder 27.

In the semiconductor memory device 2, the simultaneous set operation and the sequential reset operation are executed on, for each of the banks 20a to 20d, memory cells corresponding to consecutive addresses (for example, in FIG. 6, $A_{C1}$ to $A_{C1+7}$, $A_{C2}$ to $A_{C2+7}$, $A_{C3}$ to $A_{C3+7}$, or $A_{C4}$ to $A_{C4+7}$). In this case, the semiconductor memory device 2 has a certain amount of latency for the simultaneous set operation and the sequential reset operation for each bank. In this embodiment, in order to minimize the latency, the time of execution of the simultaneous set operation and the time of execution of the sequential reset operation are shifted for each bank, thereby allowing the reset operation to be executed in sequence when viewed outside the memory.

Figure 7:
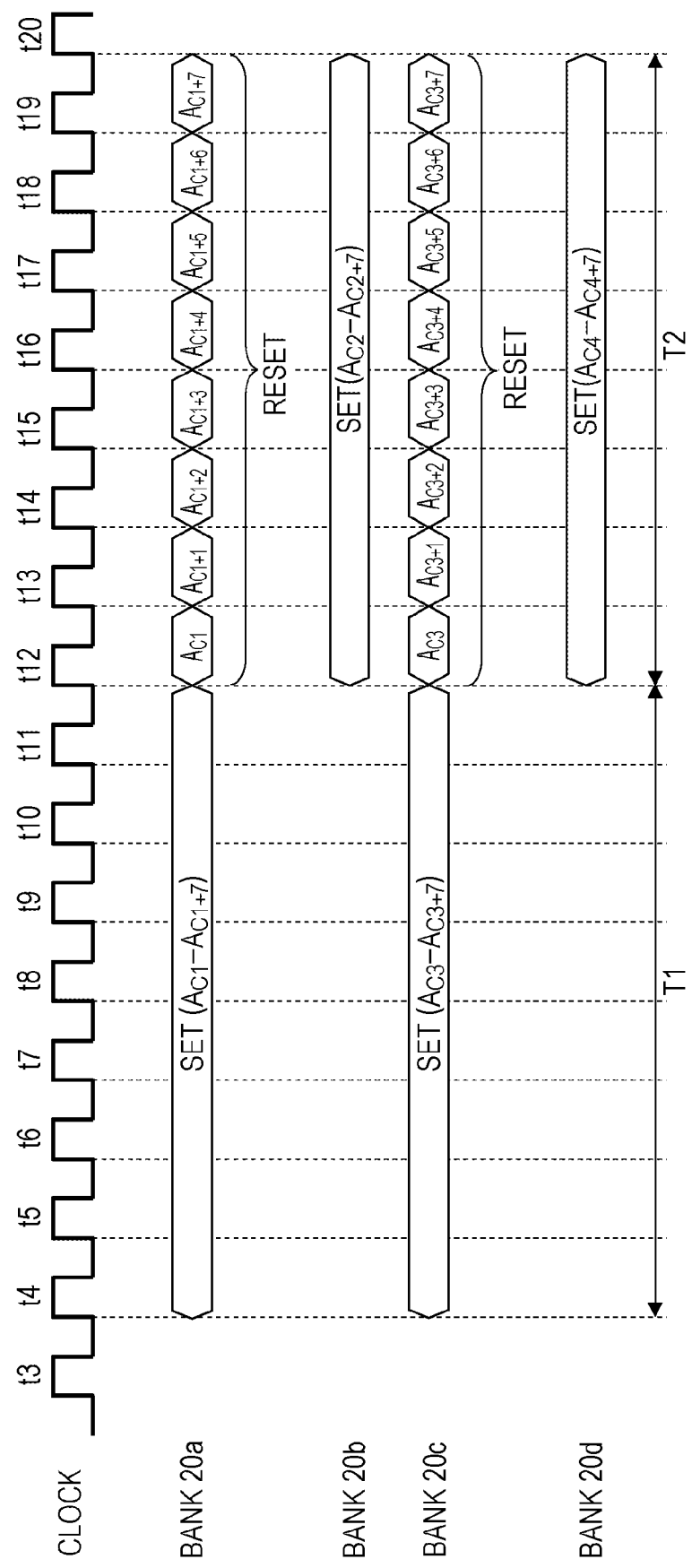
FIG. 7 is a timing chart illustrating an example of a rewriting operation method according to the present invention for the semiconductor memory device including the plurality of banks.

Specifically, in at least two banks (for example, 20a and 20b) among the banks 20a to 20d, the simultaneous set operation for selected memory cells in one bank and the sequential reset operation for selected memory cells in the other bank are executed in the same operation cycle. FIG. 7 illustrates a timing chart of an operation with the configuration described above.

In an operation cycle T1 including clocks t4 to t11, the simultaneous set operation is executed on consecutive memory cells in the bank 20a which are identified by addresses $A_{C1}$ to $A_{C1+7}$. The simultaneous set operation is also executed on consecutive memory cells in the bank 20c which are identified by addresses $A_{C3}$ to $A_{C3+7}$.

In an operation cycle T2 including clocks t12 to t19, the sequential reset operation is executed on the consecutive memory cells in the bank 20a which are identified by addresses $A_{C1}$ to $A_{C1+7}$, and the simultaneous set operation is executed on consecutive memory cells in the bank 20b which are identified by addresses $A_{C2}$ to $A_{C2+7}$. In addition, the sequential reset operation is executed on the consecutive memory cells in the bank 20c which are identified by addresses $A_{C3}$ to $A_{C3+7}$, and the simultaneous set operation is executed on consecutive memory cells in the bank 20d which are identified by addresses $A_{C4}$ to $A_{C4+7}$.

In the example in FIG. 7, the resistances of the variable resistance elements of all the memory cells corresponding to the addresses $A_{C1}$ to $A_{C1+7}$, $A_{C2}$ to $A_{C2+7}$, $A_{C3}$ to $A_{C3+7}$, and $A_{C4}$ to $A_{C4+7}$ are converted to high resistances using the reset operation. In the sequential reset operation, in contrast, it may only be required to select a memory cell that needs to undergo the reset operation in accordance with the rewriting data of the respective memory cells and to apply a reset voltage pulse to the selected memory cell or cells, whereas the reset voltage pulse may not necessarily be applied to a memory cell in which the variable resistance element is kept at a low-resistance state.

The configuration described above may minimize the latency for the simultaneous set operation and the sequential reset operation, and may implement a high-speed operation.

According to an embodiment of the present invention, a low-power consumption, large-capacity semiconductor memory device capable of performing low-voltage and low-current rewriting without reducing the rewriting operation speed may be achieved.

In the semiconductor memory device 1, the memory cell array 20 is configured such that source lines extend in parallel to the row direction, that is, in parallel to bit lines. The memory cell array 20 may also be configured such that source lines extend in parallel to the column direction, that is, the direction perpendicular to bit lines. In the present invention, the configuration of the memory cell array 20 is not limited to the circuit configuration illustrated in FIG. 2. Any circuit configuration in which memory cells arranged in a matrix are connected to each other through the bit lines, source lines, and word lines may be used. While in FIG. 2, the ends of the input-output terminal pairs of the memory cell on the variable resistance element R side are connected to the bit lines, and the ends on the selection transistor T side are connected to the source lines. Alternatively, the ends on the variable resistance element R side may be connected to the source lines, and the ends on the selection transistor side T may be connected to the bit lines.

In the foregoing embodiment, furthermore, a description has been given of a method for simultaneously applying a set voltage pulse to a plurality of adjacent selected memory cells connected to the same word line in the simultaneous set operation. However, the present invention is not limited thereto. A plurality of memory cells connected to different word lines may be selected, and a set voltage pulse may be simultaneously applied to the plurality of selected memory cells.

In addition, in a case where a plurality of adjacent selected memory cells connected to the same word line include a memory cell having a variable resistance element in a low-resistance state, there is no need to apply a set voltage pulse to such a memory cell.

An embodiment of the present invention is applicable to semiconductor memory devices, and more specifically to a non-volatile semiconductor memory device including a variable resistance element in which a transition in resistance state occurs in response to the application of voltage and which stores information in accordance with the resistance state after the transition.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
a memory cell array including a plurality of memory cells arranged in at least one of a row direction and a column direction, each of the plurality of memory cells having a variable resistance element including a first electrode and a second electrode and a selection transistor, one of the first electrode and the second electrode of the variable resistance element being connected to one of input and output terminals of the selection transistor,
the variable resistance element further including a variable resistor between the first electrode and the second electrode, the variable resistor including metal oxide, such that an electrical resistance between the first electrode and the second electrode changes in accordance with application of an electrical stress between the first electrode and the second electrode, thereby storing information in the semiconductor memory device; and
a control circuit configured to control a reset operation and a set operation,
the reset operation being an operation of applying a reset voltage pulse having a first polarity to ends of a memory cell among the memory cells to convert an electrical resistance between the first electrode and the second electrode of the variable resistance element of the memory cell to a high resistance in a high-resistance range,
the set operation being an operation of applying a set voltage pulse having a second polarity opposite to the first polarity to ends of a memory cell among the memory cells to convert an electrical resistance between the first electrode and the second electrode of the variable resistance element of the memory cell to a low resistance in a low-resistance range, wherein
the control circuit is configured to, in the set operation, apply a certain voltage to a control terminal of the selection transistor of the memory cell to limit an upper limit of a set current flowing between the first electrode and the second electrode to a low electric current, and perform control, while limiting the upper limit of the set current to the low electric current, to apply the set voltage pulse to the plurality of memory cells for a longer time than a time during which the reset voltage pulse is applied in the reset operation.

2. The semiconductor memory device according to claim 1, wherein
the time during which the reset voltage pulse is applied is set shorter than a minimum time during which the set voltage pulse is applied, which is required for an electrical resistance between the first electrode and the second electrode after application of the set voltage pulse to be in the low-resistance range to perform the set operation while limiting the upper limit of the set current to the low electric current.

3. The semiconductor memory device according to claim 1, wherein in a case where the set voltage pulse is applied to ends of the memory cell in the set operation while the set current is limited, the variable resistance element has a characteristic in which an electrical resistance between the first electrode and the second electrode after the set operation changes to a high-resistance side as the upper limit of the set current decreases and in which an electrical resistance between the first electrode and the second electrode after the set operation changes to the high-resistance side as the time during which the set voltage pulse is applied is reduced.

4. The semiconductor memory device according to claim 1, wherein in the reset operation, the reset voltage pulse is applied without limiting, using the selection transistor, a reset current flowing between the first electrode and the second electrode of the variable resistance element of the memory cell.

5. The semiconductor memory device according to claim 1, wherein the memory cell array is configured such that the memory cells are arranged in at least column direction, the control terminals of the selection transistors of memory cells arranged in same column are mutually connected to a word line extending in the column direction, and the set operation is a simultaneous set operation that is an operation of simultaneously applying the set voltage pulse to a first group of memory cells including a plurality of adjacent memory cells in the column direction in which the control terminals of the selection transistors are connected to the same word line.

6. The semiconductor memory device according to claim 5, wherein the control circuit controls a sequential reset operation after the simultaneous set operation, the sequential reset operation being an operation of selecting a second group of memory cells including one or more memory cells to be reset from among the first group of memory cells, and sequentially executing the reset operation on the one or more memory cells in the second group of memory cells.

7. The semiconductor memory device according to claim 6, wherein the memory cell array is divided into a plurality of banks each including the plurality of memory cells, and the simultaneous set operation for the plurality of memory cells in one of the plurality of banks and the sequential reset operation for a memory cell in another of the plurality of banks are executed in parallel in an identical operation cycle.

8. The semiconductor memory device according to claim 6, wherein the control circuit controls a verifying operation after the simultaneous set operation and before the sequential reset operation, the verifying operation being an operation of reading resistance states of the variable resistance elements of all memory cells to which the set voltage pulse is applied, again selecting a memory cell for which an electrical resistance between the first electrode and the second electrode of the variable resistance element is not in the low-resistance range, and performing the set operation on the selected memory cell.

9. The semiconductor memory device according to claim 1, wherein the control circuit controls a forming operation before executing the set operation and the reset operation, the forming operation being an operation of applying an electrical stress between the first electrode and the second electrode of a variable resistance element that is in an initially high-resistance state to convert the electrical resistance between the first electrode and the second electrode to a low resistance.

10. The semiconductor memory device according to claim 1, wherein each of the selection transistors has an on-resistance lower than at least an upper limit of the low-resistance range.

11. The semiconductor memory device according to claim 1, wherein the low-resistance range has an upper limit less than or equal to 100 kΩ, and the high-resistance range has a lower limit greater than or equal to 1 MΩ.

* * * * *